United States Patent [19]

Sawada

[11] Patent Number: 5,491,656

[45] Date of Patent: Feb. 13, 1996

[54] NON-VOLATILE SEMICONDUCTOR MEMORY DEVICE AND A METHOD OF USING THE SAME

[75] Inventor: Kikuzo Sawada, Sagamihara, Japan

[73] Assignee: Nippon Steel Corporation, Tokyo, Japan

[21] Appl. No.: 231,684

[22] Filed: Apr. 25, 1994

Related U.S. Application Data

[63] Continuation-in-part of Ser. No. 50,660, Apr. 22, 1993, Pat. No. 5,408,429.

[30] Foreign Application Priority Data

Apr. 24, 1992 [JP] Japan .................................. 4-131491
Apr. 26, 1993 [JP] Japan .................................. 5-122013

[51] Int. Cl.$^6$ ................................................ G11C 11/34
[52] U.S. Cl. ........................ 365/185.29; 365/185.18; 365/185.27; 365/185.12
[58] Field of Search ............................. 365/185, 900, 365/218, 182

[56] References Cited

U.S. PATENT DOCUMENTS

| | | | |
|---|---|---|---|
| 4,698,787 | 10/1987 | Mukberjee et al. | 365/185 |
| 5,077,691 | 12/1991 | Haddad et al. | 365/185 X |
| 5,122,985 | 6/1992 | Santin | 365/185 |
| 5,222,040 | 6/1993 | Challa | 365/185 |
| 5,297,096 | 3/1994 | Terada et al. | 365/218 |
| 5,309,402 | 5/1994 | Okazawa | 365/218 |
| 5,315,547 | 5/1994 | Shoji et al. | 365/185 |

FOREIGN PATENT DOCUMENTS

| | | |
|---|---|---|
| 61-127179 | 6/1986 | Japan . |
| 613219496 | 9/1991 | Japan . |

OTHER PUBLICATIONS

"Flash Memory Technology and its Future" Yasushi Terada, Institute of Electronics, Information and Communication, ICD91–134 (prev. sub), 1991, pp. 1–8.

"The Cell Technology of a 16M Flash Memory Is Converging" Nikkei Micro Device, Jul. 1991 (prev. sub), pp. 73–75.

"Flash EEPROM Cell Scaling Based on Tunnel Oxide Thinning Limitations" 1991 Yashikawa et al., VLSI Symposium Technology (prev. submitted), pp. 77–80.

"A Novel Cell Structure Suitable for A 3 Volt Operation Sector Erase Flash Memory" Onoda et al., IEDM 92–599–602, 1992.

"SI Thermally–Oxidized Film and Its Interface" pp. 355–371, Realize Corp. (prev. sub.).

"Design of CMOS Ultra–LSI" 1989 pp. 172–173 (prev. sub.).

*Primary Examiner*—David C. Nelms
*Assistant Examiner*—Huan Hoang
*Attorney, Agent, or Firm*—Pollock, Vande Sande & Priddy

[57] ABSTRACT

An electrically alterable non-volatile semiconductor memory. The memory cells are formed in a matrix of columns and rows. A row decoder and column decoder are provided to select one of the row lines and column lines. Mode selection means are provided for selecting a writing mode, a first erasing mode for erasing a row of memory cells, a second erasing mode for erasing a selected memory cell on a bit basis, and a reading mode for reading the contents of each memory cell. The individual erasing modes reduce the overall power consumption of the device, while permitting block erasing as well as individual cell erasing.

7 Claims, 3 Drawing Sheets

NON-VOLATILE SEMICONDUCTOR MEMORY DEVICE AND A METHOD OF USING THE SAME

CROSS-REFERENCE TO RELATED APPLICATION

This application is a continuation-in-part of U.S. patent application Ser. No. 08/050,660 filed on Apr. 22, 1993, now U.S. Pat. No. 5,408,429, which is incorporated herein by reference.

BACKGROUND OF THE INVENTION

1. Field of the Invention

This application relates to an electrically rewritable and non-volatile semiconductor memory device and a method of using the same.

2. Description of the Related Art

Document 1: "SINGLE TRANSISTOR ELECTRICALLY PROGRAMMABLE MEMORY DEVICE AND METHOD", U.S. Pat. No. 4,698,787 (Oct. 6, 1987), Document 2: "FLASH EEPROM ARRAY WITH NEGATIVE GATE VOLTAGE ERASE OPERATION", U.S. Pat. No. 5,077,691 (Dec. 31, 1991), Document 3: "NON-VOLATILE SEMICONDUCTOR MEMORY DEVICE", JP-A-3-219496, Document 4: "CIRCUIT AND METHOD FOR ERASING EEPROM MEMORY ARRAYS TO PREVENT OVER-ERASED CELLS", U.S. Pat. No. 5,122,985 (Jun. 16, 192), and Document 5: "A NOVEL CELL STRUCTURE SUITABLE FOR A 3 VOLT OPERATION, SECTOR ERASE FLASH MEMORY", IEDM 92-599-602, 1992.

As non-volatile semiconductor memory devices, an ultraviolet erasable type EPROM (Erasable and Programmable Read Only Memory) and an electrically and erasable (hereinafter referred to as "electrically alterable") EEPROM (Electrically Erasable and Programmable Read Only Memory) are well known heretofore, while recently an electrically flash EEPROM is developed.

More particularly, data stored in memory cells of the EPROM can be erased only by ultraviolet rays and can not be erased electrically. Accordingly, the EPROM requires a package with a transparent window. Further, in order to alter the stored data in the EPROM after mounting the EPROM on a board of a system, the EPROM must be disadvantageously removed from the board once. On the other hand, the EEPROM can be altered in a system, while generally the EEPROM has memory cells each requiring transistors for selection and separation and a channel area and accordingly there is a problem that an area of a memory cell thereof is about two times larger than that of the EPROM. Thus, in order to solve the problems, a flash type EEPROM capable of being electrically erased and having a memory cell area which is substantially equal to that of the EPROM has been developed.

The flash type EEPROM proposed in the early stage is described in the document 1, for example. This document discloses a method and a device structure for performing electrical writing and erasing by means of a single memory transistor having a floating gate. More particularly, in the erasing operation, a high voltage of 10 to 20 V is applied to a source terminal of a memory cell and a ground potential is applied to a control gate terminal to thereby generate a high electrical field in a thin insulating layer between a floating gate and the source terminal so that electrons are emitted from the floating gate by Fowler-Nordheim tunneling (hereinafter referred to as "FN injection") to thereby lower a threshold voltage of the memory cell as viewed from the control gate. On the other hand, in the writing operation, by applying a voltage of 5 to 10 V to a drain terminal of the memory cell and a high voltage of 10 to 15 V to the control gate and connecting a source to the ground, a strong inversion area is formed in a surface of a substrate between the drain and the source to generate hot electrons, so that electrons is injected into the floating gate (hereinafter referred to as "HE injection") to thereby raise the threshold voltage of the memory cell.

Further, the document 2 discloses a method in which the writing operation is the same as that of the document 1 and in the erasing operation by applying a negative voltage of −12 to −17 V to a control gate and connecting a source to the ground, electrons are pulled out from the floating gate by the FN injection. This method is improved as compared with the method of the document 1 in that a high voltage is not applied to the source in the erasing operation to thereby reduce a leakage current generated from the source in the erasing operation and further application of the negative voltage can be switched in a unit of row line by simplifying the generation of a high positive voltage and by connecting the control gates to a row line to perform decoding, so that erasing in a unit of selected row line can be attained instead of the flash type erasing.

Further, the document 3 discloses that, in addition to the method disclosed in the document 2, by applying a negative voltage of about −7 V to a control gate and a voltage of about 5 to 0 V to a drain and connecting a source to the ground in the erasing operation, erasing in a unit of bit can be attained by the FN injection, and in the writing operation by applying a high voltage of about 10 V to the control gate, a voltage of about 4 V to the source and a voltage of 0 V to the drain or making the drain open, writing in a unit of bit can be attained by the HE injection.

All of the methods disclosed in the above documents utilize the HE injection in the writing operation and the FN injection in the erasing operation although the applied voltages are different.

On the other hand, U.S. patent application Ser. No. 08/050,660, filed on Apr. 22, 1993, entitled "METHOD OF ALTERING A NON-VOLATILE SEMICONDUCTOR MEMORY DEVICE" or the document 5 discloses a method in which in the erasing operation by applying a high voltage of about 7 to 10 V to a control gate and a negative voltage of about −7 to −10 V to a substrate, a drain and a source, electrons are injected from a surface of the substrate into a floating gate by the FN injection to increase a threshold voltage of a memory cell. This method can attain erasing in a unit of row line. Further, in the writing operation, by applying a negative voltage of about −6 to −10 V to the control gate and a voltage of about 5 to 0 V to the drain, electrons are pulled out from the floating gate to the drain by the FN injection. Thus, by connecting the drain to a column line, writing in a unit of bit can be attained. This method is featured by a single memory transistor and utilization of the FN injection for both the erasing and writing.

Generally, the merit of utilizing the FN injection in the writing and erasing operation resides in no necessity of conducting a large current between a drain and a source of a memory cell for injection or discharge of electrons to the floating gate, a low power consumption in the writing operation because of a reduced current required for the FN injection, no necessity of providing an external power terminal for a high voltage or a negative voltage even if the high or negative voltage is required and a charge pump circuit provided in a memory device to be able to supply the voltage. On the other hand, a drawback thereof is that a writing speed is slow as compared with the HE injection (for example, about 10 μs per bit for the HE injection, while about 1 ms for the FN injection).

On the contrary, in the HE injection, a time required for the writing and erasing operation is relatively short, while since it is necessary to conduct a large current between a drain and a source of a memory cell in the injection, there is a drawback that a consumption current becomes large (for example, a current between the drain and the source in the HE injection is about 1 mA per bit, while it is smaller than about 1 μA in the FN injection).

SUMMARY OF THE INVENTION

It is an object of the present invention to provide an electrically alterable non-volatile semiconductor memory device and a method of using the same in which both merits in altering by the FN injection and the HE injection are utilized to perform erasing with lower power consumption by the FN injection in block erasing operation for erasing a plurality of memory cells connected to a selected row line simultaneously and to perform erasing by the HE injection in bit erasing operation for erasing only a selected memory cell to attain rapid altering speed.

An electrically alterable non-volatile semiconductor memory device according to the present invention comprises a plurality of memory cells formed on a semiconductor substrate and arranged in a matrix of columns and rows and each having a control gate, a floating gate, a drain and a source; a plurality of row lines each connected to the control gates of the memory cells arranged in one row; a plurality of column lines each connected to the drain of the memory cells arranged in one column; one source line connected to the sources of the plurality of memory cells; a row decoder for selecting one of the plurality of row lines; a column decoder for selecting one of the plurality of column lines; an input terminal for inputting data which is to be written in a selected memory cell; mode selection means for selecting one of four modes, i.e. a writing mode for setting a selected one of the plurality of memory cells in a written state in accordance with the inputted data, a first erasing mode for setting a memory cell group arranged in one row including the selected memory cell in an unwritten state, a second erasing mode for setting only the selected memory cell in the unwritten state, and a reading mode for detecting whether the selected memory cell is in the written state or the unwritten state; and voltage applying means for applying one set of voltages selected from first, second, third and fourth predetermined sets of voltages in accordance with the mode selected by the mode selection means to a row line selected by the row decoder, non-selected row lines, a column line selected by the column decoder, non-selected column lines, the source line and the substrate, respectively; the voltage applying means including column line selection voltage applying means for applying a voltage having the same level to the selected column line and the non-selected column lines when the first erasing mode is selected and for applying voltages having different levels to the selected column line and the non-selected column lines when the second erasing mode is selected.

A method of using an electrically alterable non-volatile semiconductor memory device of the aforementioned type according to the present invention, comprises a step of applying a voltage having substantially the same level as a voltage applied to the substrate to all of the plurality of column lines and injecting electrons by FN injection from the substrate to the floating gate of each of the memory cells connected to one row line selected by the row decoder thereby setting the memory cells in the unwritten state when the first erasing mode is selected; a step of setting one column line selected by the column decoder in a ground potential and applying a voltage higher than the ground voltage to the source line to inject hot electrons in the floating gate of the selected memory cell thereby setting the selected memory cell in the unwritten state when the second erasing mode is selected; and a step of applying a voltage having substantially the same level as the voltage applied to the source line to the column lines other than one column line selected by the column decoder to prevent hot electrons from being injected in the floating gates of those memory cells connected to the selected row line other than the selected one.

DESCRIPTION OF THE PREFERRED EMBODIMENTS

Figure 1A:
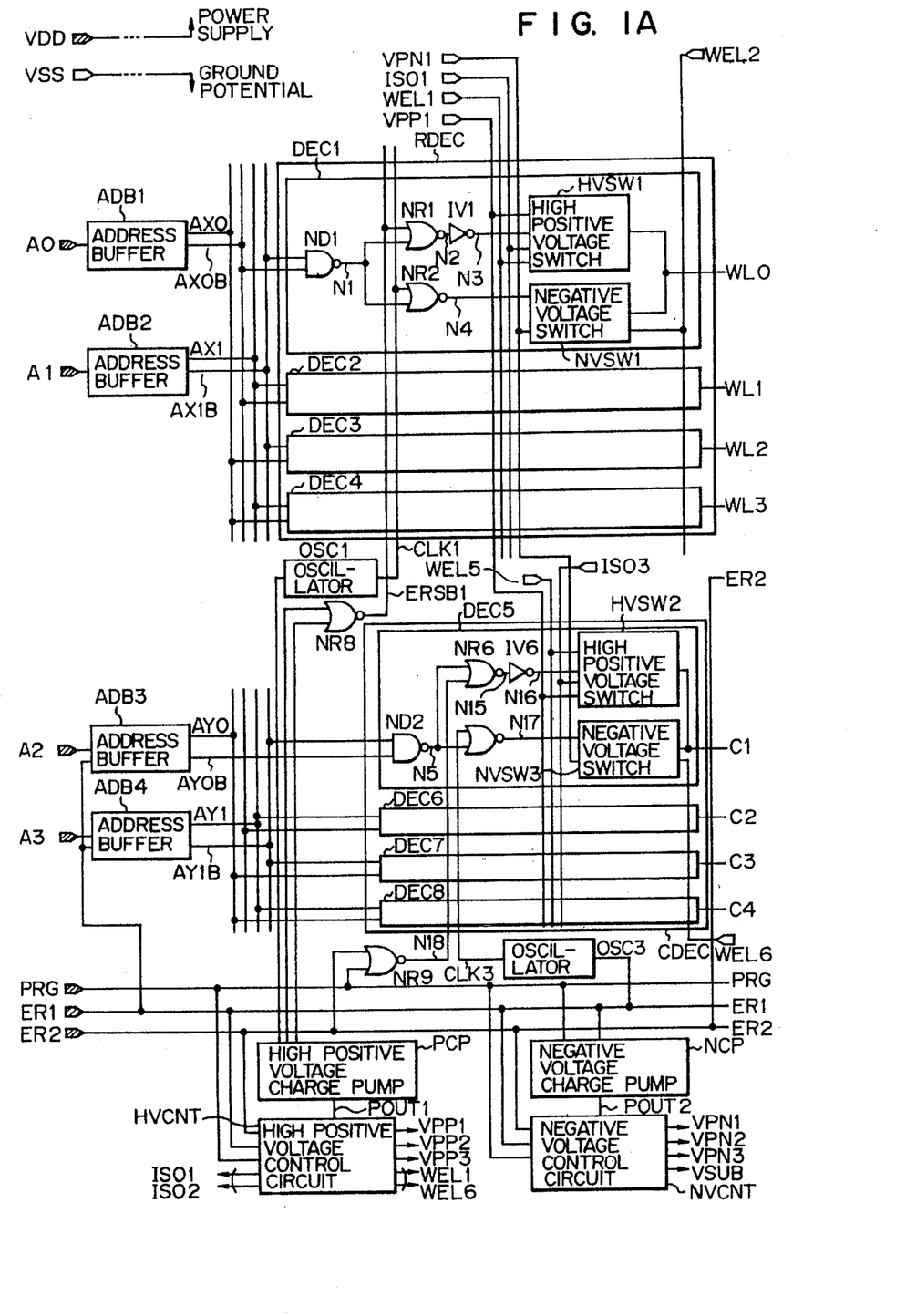
FIGS. 1A and 1B, in combination, schematically illustrate a non-volatile semiconductor memory device according to an embodiment of the present invention in which lines extending on the right of FIG. 1A are connected to lines on the left of FIG. 1B.
Figure 1B:
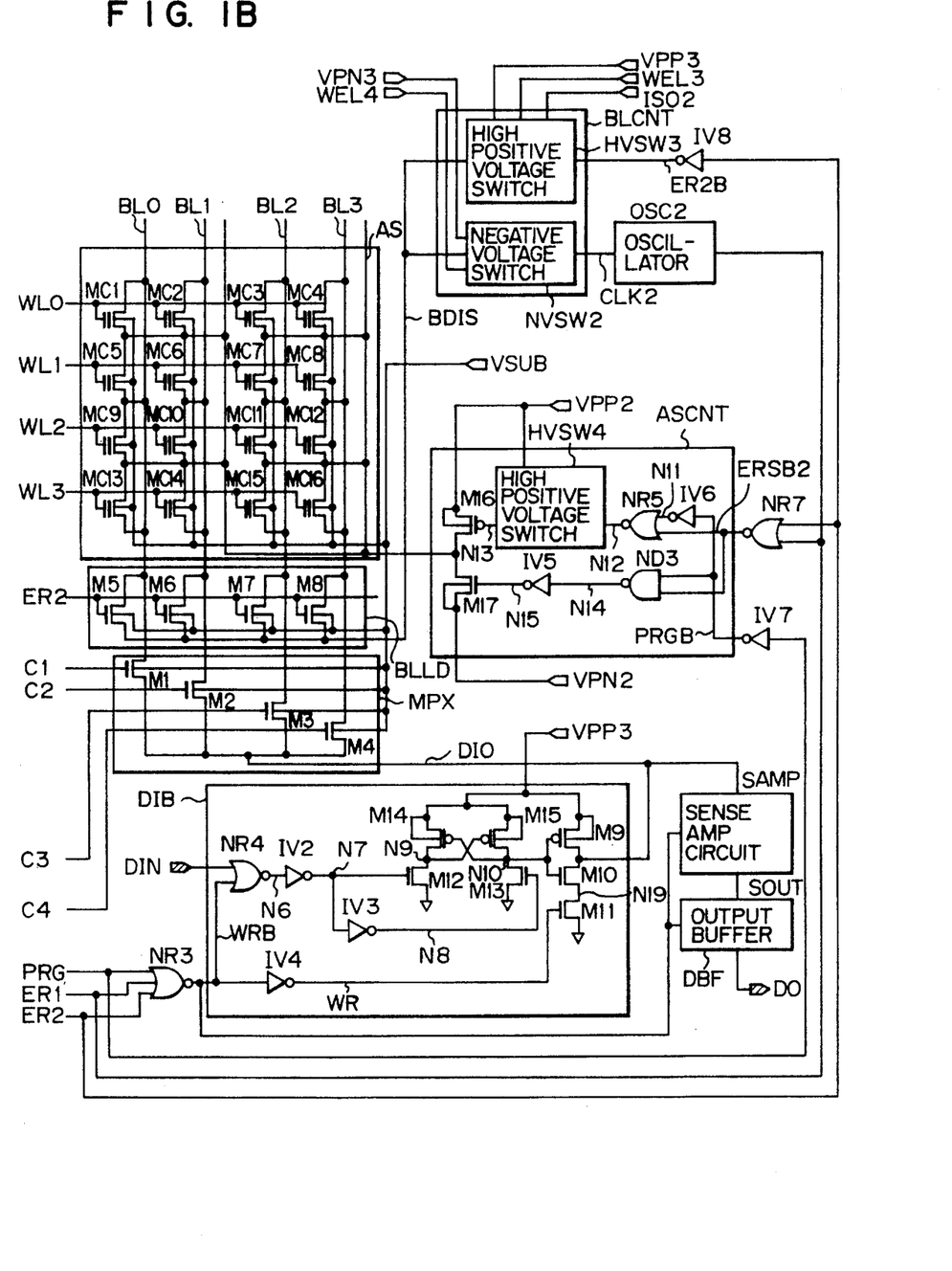

A non-volatile semiconductor memory device EEPROM according to an embodiment of the present invention is now described with reference to the accompanying drawings. FIGS. 1A and 1B, in combination, schematically illustrate a non-volatile semiconductor memory device according to an embodiment of the present invention in which lines extending on the right of FIG. 1A are connected to lines on the left of FIG. 1B.

The EEROM of the embodiment includes address input terminals A0, A1, A2 and A3 for inputting an address from the outside, a data input terminal DIN for inputting an input data, and an output terminal DO for outputting an output data. Further, the EEROM comprises address buffers ADB1, ADB2, ADB3 and ADB4, a row decoder RDEC including decoders DEC1, DEC2, DEC3 and DEC4, and a column decoder CDEC including decoders DEC5, DEC6, DEC7 and DEC8 as shown in FIG. 1A and a memory block MBLK including memory cells MC1, MC2, . . . MC16, a multiplexer MPX, a data input buffer DIB, a sense amplifier SAMP, and an output buffer circuit DBF as shown in FIG. 1B. In addition, the EEROM comprises charge pump circuits PCP and NCP, a high positive voltage control circuit HVCNT, negative voltage control circuit NVCNT, a memory cell source line voltage control circuit ASCNT, a bit line voltage control circuit BLCNT, a bit line load circuit BLLD, oscillators OSC1, OSC2 and OSC3, and other logic circuits. Further, a positive voltage (for example, 5 V) is supplied as a power supply for the whole circuit through a terminal VDD from the outside and a ground voltage is supplied through a terminal VSS.

As shown in FIG. 1A, the address terminals A0, A1, A2 and A3 are connected to inputs of the address buffers ADB1, ADB2, ADB3 and ADB4, respectively. Outputs AX0 and AX0B of the address buffer ADB1 and outputs AX1 and AX1B of the address buffer ADB2 are connected to inputs of inversion AND gates (hereinafter referred to as "NAND gates") of the row decoder RDEC and outputs AY0 and AY0B of the address buffer ADB3 and outputs AY1 and AY1B of the address buffer ADB4 are connected to inputs of NAND gates of the column decoder.

The row decoder RDEC includes four decoders DEC1, DEC2, DEC3 and DEC4, each of which has the same circuit configuration. The decoder DEC1 includes a two-input NAND gate ND1 having inputs connected to the outputs of the address buffers ADB1 and ADB2, 2 two-input inversion OR gates (hereinafter referred to as "NOR gates") NR1 and NR2, an inverter IV1, a high positive voltage switch circuit HVSW1, and a negative voltage switch circuit NVSW1. An output of the NAND gate ND1 is supplied to one input of the NOR gates NR1 and NR2, and signals ERSB1 and CLK1 are supplied to other inputs of the NOR gates NR1 and NR2, respectively. An output N2 of the NOR gate NR1 is connected to an input of the inverter IV1 and an output N3 of the inverter IV1 is connected to an input of the high positive voltage switch circuit HVSW1. An output N4 of the NOR gate NR2 is connected to an input of the negative voltage switch circuit NVSW1.

The high positive voltage switch circuit HVSW1 receives input high voltage signals VPP1, WEL1 and ISO1 and produces an output which is connected to a row line (word line) of the memory block MBLK. The negative voltage switch circuit NVSW1 receives inputs of signals N4 and WEL2 and a negative voltage signal VPN1 and produces an output, which is connected to the row line, to which the output of the high positive voltage switch circuit HVSW1 is connected.

The decoders DEC2, DEC3 and DEC4 have the same circuit configuration as that of the decoder DEC1, while a combination of input signals supplied to the NAND gate and a row line connected to the output of each of the decoders are different.

The column decoder CDEC includes 4 decoders DEC5, DEC6, DEC7 and DEC 8 each having the same circuit configuration. The decoder DEC5 includes a two-input NAND gate ND2 having inputs connected to outputs of the address buffers ADB3 and ADB4, 2 two-input NOR gates NR6 and NR7, an inverter IV6, a high positive voltage switch circuit HVSW2 and a negative voltage switch circuit NVSW3. An output N5 of the NAND gate ND2 is supplied to one input of each of the NOR gates NR6 and NR7. An output N18 is supplied to the other input of the NOR gate NR6 and a signal CLK3 is supplied to the other input of the NOR gate NR7. An output N15 of the NOR gate NR6 is connected to an input of the inverter IV6 and an output N16 of the inverter IV6 is connected to an input of the high positive voltage switch circuit HVSW2 and an output N17 of the NOR gate NR7 is connected to an input of the negative voltage switch circuit NVSW3.

The high positive voltage switch HVSW2 receives, as inputs, the output N16, the high voltage signal VPP1 and signals WEL5 and ISO3 and produces an output, which is connected to a column line selection signal line C1. The negative voltage switch circuit NVSW3 receives as inputs, the output N17, an signal WEL6 and the negative voltage signal VPN1 and produces an output, which is connected to the column line selection signal line, to which the output of the high positive voltage switch circuit HVSW2 is connected.

The decoders DEC6, DEC7 and DEC8 have the same circuit configuration as that of the decoder DEC5, while a combination of input signals supplied to the NAND gate and a column line selection signal line connected to the output of each of the decoders are different.

As shown in FIG. 1B, the memory block MBLK includes 16 memory cells MC1, MC2, . . . MC16 and each of the memory cells includes a drain terminal, a source terminal, a control gate terminal, and a floating gate terminal, and a common substrate terminal is provided to all of the memory cells. Each memory cell includes, for example, a drain region and a source region formed in a surface area of a semiconductor substrate, a thin oxide layer formed in the surface of the semiconductor substrate at its area between the drain region and the source region, a floating gate made of, for example, polycrystalline silicon and overlying the thin oxide layer and a control gate made of, for example, polycrystalline silicon and formed on the floating gate with an insulating layer interposed therebetween. Further, the drain region, the source region, the control gate and the substrate are electrically connected to the drain terminal, the source terminal, the control gate terminal and the substrate terminal, respectively.

The control gate terminals of the memory cells MC1, MC2, MC3 and MC4 are connected to a row line WL0, the control gate terminals of the memory cells MC5, MC6, MC7 and MC 8 to a row line WL1, the control gate terminals of the memory cells MC9, MC10, MC11 and MC12 to a row line WL2, and the control gate terminals of the memory cells MC13, MC14, MC15 and MC16 to a row line WL3. The drain terminals of the memory cells MC1, MC5, MC9 and MC13 are connected to a column line BL0, the drain terminals of the memory cells MC2, MC6, MC10 and MC14 to a column line BL1, the drain terminals of the memory cells MC3, MC7, MC11 and MC15 to a column line BL2, and the drain terminals of the memory cells MC4, MC8, MC12 and MC16 to a column line BL3. That is, the memory cells are formed into an array of 4 rows×4 columns. Further, the source terminals of the memory cells MC1, MC2, . . . MC16 are connected to a common memory source line AS and the substrate terminals of the memory cells MC1, MC2, . . . MC16 are connected to a substrate voltage signal line VSUB.

The multiplexer MPX includes N-channel enhancement type MOS transistors M1, M2, M3 and M4, for example. A drain of the transistor M1 is connected to the column line BL0 and a gate thereof is connected to the column selection signal line C1. A drain of the transistor M2 is connected to the column line BL1 and a gate thereof is connected to the column selection signal line C2. A drain of the transistor M3 is connected to the column line BL2 and a gate thereof is connected to the column selection signal line C3. A drain of the transistor M4 is connected to the column line BL3 and a gate thereof is connected to the column selection signal line C4. The substrates of the transistors M1, M2, M3 and M4 are connected to the substrate voltage signal line VSUB and the sources thereof are connected to an internal data line DIO.

The data input buffer DIB includes a two-input NOR gate NR4, inverters IV2, IV3 and IV4, MOS transistors M10, M11, M12 and M13 of, for example, N-channel enhancement type, and MOS transistors M9, M14 and M15 of, for example, P-channel enhancement type. One input terminal of the NOR gate NR4 is connected to the data input terminal DIN and the other input terminal thereof is connected to WRB. An output N6 of the NOR gate NR4 is connected to an input of the inverter IV2 and an output N7 of the inverter IV2 is connected to an input of the inverter IV3 and a gate terminal of the transistor M12. An output N8 of the inverter IV3 is connected to a gate terminal of the transistor M13 and a drain terminal of the transistor M13 is connected to N10, a gate terminal of the transistor M14, a drain terminal of the transistor M15, a gate terminal of the transistor M9 and a gate terminal of the transistor M10. A drain terminal of the transistor M12 is connected to N9, a drain terminal of the transistor M14 and a gate terminal of the transistor M15. Further, source terminals and substrate terminals of the transistors M14, M15 and M9 are connected to a high voltage signal line VPP3, and sources of the transistors M12, M13, and M11 are connected to the ground terminal VSS. Substrate terminals of the transistors M12, M13, M10 and M11 are also connected to the ground terminal VSS. An input of the inverter IV4 is connected to WRB and an output WR of the inverter IV4 is connected to a gate terminal of the transistor M11. A drain terminal of the transistor M11 is connected to N19 and a source terminal of the transistor M10, and drain terminals of the transistors M10 and M9 are connected to the internal data line DIO.

The memory source line voltage control circuit ASCNT includes inverters IV5 and IV6, a two-input NOR gate NR5, a two-input NAND gate ND3, a high positive voltage switch circuit HVSW4, an N-channel enhancement type MOS transistor M17 and a P-channel enhancement type MOS transistor M16. An input and an output N11 of the inverter IV6 are connected to PRGB and one input terminal of the NOR gate NR5, respectively, and the other input terminal of the NOR gate NR5 is connected to ERSB2. One input terminal and the other input terminal of the NAND gate ND3 are connected to PRGB and ERSB2, respectively. An output N12 of the NOR gate NR5 is connected to one input of the high positive voltage switch circuit HVSW4 and an output N14 of the NAND gate ND3 is connected an input of the inverter IV5 having an output N15 connected to a gate terminal of the transistor M17. The high positive voltage switch circuit HVSW4 receives a high voltage signal VPP2 and the output N12 and produces an output N13, which is connected to a gate of the transistor M16. A source terminal of the transistor M16 is connected to the VPP2 and drain terminals of the transistors M16 and M17 are connected to the memory source line AS. A substrate terminal of the transistor M16 is connected to the VPP2 and a source terminal and a substrate terminal of the transistor M17 are connected to a negative voltage signal line VPN2.

The bit line load circuit BLLD includes N-channel enhancement type MOS transistors M5, M6, M7 and M8. A drain terminal of the transistor M5 is connected to the column line (bit line) BL0, a drain terminal of the transistor M6 to the column line BL1, a drain line of the transistor M7 to the column line BL2, and a drain terminal of the transistor M8 to the column line BL3. Gate terminals, source terminals, and substrate terminals of the transistors M5, M6, M7 and M8 are connected to a bit erasing signal line ER2, an output BDIS and the substrate voltage signal line VSUB, respectively.

The bit line voltage control circuit BLCNT includes a high positive voltage switch circuit HVSW3 and a negative voltage switch circuit NVSW2. The high positive voltage switch circuit HVSW3 receives, as inputs, an output ER2B of an inverter IV8, WEL3, ISO2 and the high voltage signal line VPP3 and produces an output BDIS. The negative voltage switch circuit NVSW2 receives, as inputs, CLK2, WEL4 and a negative voltage signal line VPN3 and produces an output BDIS.

A write signal line PRG is connected to an input of the high positive voltage charge pump circuit PCP, an input of the negative voltage charge pump circuit NCP, an input of the high positive voltage control circuit HVCNT, an input of the negative voltage control circuit NVCNT, an input of the oscillator OSC1, an input of a three-input NOR gate NR3, an input of a two-input NOR gate NR9, and an input of an inverter IV7.

A block erasing signal line ER1 is connected to inputs of the address buffer ADB3, the address buffer ADB4, the high positive voltage charge pump circuit PCP, the high positive voltage control circuit HVCNT, the negative voltage control circuit NVCNT, the negative voltage charge pump circuit NCP, the three-input NOR gate NR3, an two-input NOR gate NR8, the NOR gate NR7, and the oscillators OSC2 and OSC3.

The bit erasing signal line ER2 is connected to inputs of the high positive voltage charge pump circuit PCP, the high positive voltage control circuit HVCNT, the negative voltage control circuit NVCNT, the three-input NOR gate NR3, the two-input NOR gates NR9 and NR7, and the inverter IV8.

An output WRB of the three-input NOR gate NR3 is connected to an input of the NOR gate NR4 and an input of the inverter IV4, an output ERSB1 of the NOR gate NR8 is connected to an input of the NOR gate NR1, an output N18 of the NOR gate NR9 is connected to an input of the NOR gate NR6, and an output ERSB2 of the NOR gate NR7 is connected to an input of the NOR gate NR5 and an input of the NAND gate ND3. An output CLK1 of the oscillator OSC1 is connected to an input of the NOR gate NR2, an output CLK2 of the oscillator OSC2 is connected to an input of the negative voltage switch circuit NVSW2, and an output CLK3 of the oscillator OSC3 is connected to an input of the NOR gate NR7.

The high positive voltage charge pump circuit PCP receives input signals from the write signal line PRG, the block erasing signal line ER1 and the bit erasing signal line ER2 and produces an output POUT1. The negative voltage charge pump circuit NCP receives input signals from the write signal line PRG and the block erasing signal line ER1 and produces an output POUT2. The high positive voltage control circuit HVCNT receives input signals from the output line POUT1, the write signal line PRG, the block erasing signal line ER1 and the bit erasing signal line ER2 and produces outputs VPP1, VPP2, VPP3, WEL1, WEL2, WEL3, WEL4, WEL5, WEL6, ISO1, ISO2 and ISO3. The negative voltage control circuit NVCNT receives input signals from the output line POUT2, the write signal line PRG, the block erasing signal line ER1 and the bit erasing signal line ER2 and produces outputs VPN1, VPN2 and VSUB. The sense amplifier SAMP receives an input from the internal data line DIO, a control input WRB and produces an output SOUT. The output buffer DBF includes an input connected to the output line SOUT, a control input connected to WRB and an output connected to the output terminal DO.

Operation of the EEROM described above is now described.

The EEROM of the embodiment is a non-volatile semiconductor memory device for performing writing operation, first and second erasing operations and reading operation for the memory cells of 16 bits (4 rows×4 columns) in a data width of 1 bit. A row line selection address is supplied from the address terminals A0 and A1, and a column line selection address is supplied from the address terminals A2 and A3.

The EEROM shown in FIG. 1 is a circuit representing the gist of the present invention in brief and may include the memory cells larger than or smaller than 16 bits, a data width larger than one bit and the number of addresses larger than or smaller than 4 without departing from the technical concept of the present invention.

Table 1 represents an example of voltages applied to the word lines, the bit lines, the source lines and the substrate in the writing operation to a selected memory cell, the block erasing operation for erasing a set of memory cells connected to the common word line at the same time, the bit erasing operation for erasing only a selected memory cell and the reading operation of a selected memory cell.

When it is assumed that the memory cell MC1 is selected, the address of A0=A1=A2=A3="L" is supplied and the output of the two-input NAND gate ND1 of the row decoder DEC1 becomes "L".

On the other hand, the oscillator OSC1 starts its oscillation in response to "H" level of the PRG and produces the output on the CLK1 (for example, amplitude of 5 V at a period of 30 MHz). The output of the two-input NOR gate NR8 is "H" and the output N3 of the inverter IV1 is "H", so that the high positive voltage switch circuit HVSW1 is turned off. The output N4 of the two-input NOR gate NR2 produces an oscillation output in accordance with N1 and CLK. Thus, the negative voltage switch circuit NVSW1 is turned on to thereby apply a voltage on VPN1, that is, −8 V to the row line. (word line) WL0. In this case, since both of the positive voltage switch circuit and the negative voltage switch circuit of the row decoders DEC2, DEC3 and DEC4 are off, voltages on the row lines WL1, WL2 and WL3 are WL1=WL2=WL3=0 V, for example. With the similar opera-

TABLE 1

| Mode | Selected Word Line | Non-Selected Word Line | Selected Bit Line | Non-Selected Bit Line | Memory Source Line | Memory Cell Substrate Volt. | Injection Type |
| --- | --- | --- | --- | --- | --- | --- | --- |
| Write | −8 V | 0 V | 5 V/0 V | 0 V | Open | 0 V | FN |
| Erase (Block) | 10 V | 0 V | −8 V | −8 V | −8 V | −8 V | FN |
| Erase (Bit) | 12 V | 0 V | 0 V/5 V | 5 V | 5 V | 0 V | HE |
| Read | 5 V | 0 V | 1.0 V | 0 V | 0 V | 0 V | |

Operation in each mode is now described with reference to Table 1 and FIGS. 1A and 1B.

First of all, the writing mode is started by changing the write signal line PRG of FIG. 1A from a low (L) level to a high (H) level (while ER1 and ER2 are maintained to "L") and the negative voltage charge pump NCP starts its operation in response to the "H" level of the write signal line PRG.

The negative voltage charge pump NCP is a circuit for producing a negative voltage of, for example, −8 V from a power supply voltage (for example, 5 V) and a ground voltage (for example, 0 V), and an example of its circuit is shown in FIG. 4 of the document 2. The negative voltage control circuit NVCNT is a circuit for controlling the negative voltage to produce voltages between 0 V and the negative voltage (for example, −8 V). When it is assumed that the write signal line PRG is "H", the block erasing signal line ER1 is "L" and the bit erasing signal line ER2 is "L", the negative voltage control circuit NVCNT produces the outputs of, for example, VPN1=−8 V and VPN2=VPN3= VSUB=0 V.

Further, at this time, the high positive voltage charge pump circuit PCP operates to produce the output POUT of, for example, 12 V. The high positive voltage charge pump circuit PCP is a circuit for producing a high positive voltage of, for example, 12 V from the power supply voltage VDD and the ground voltage and an example of its circuit is shown in FIG. 5 of the document 2. The high positive voltage control circuit HVCNT is a circuit for controlling the high positive voltage to produce output voltages between 0 V and the high positive voltage (for example, 12 V). When the PRG is "H" and the ER1 and ER2 are "L", the high positive voltage control circuit HVCNT produces the outputs of, for example, VPP1=WEL5=WEL6=12 V, VPP2= VPP3=WEL3=WEL4=ISO1=5 V and ISO2=ISO3=WEL1= WEL2=0 V.

tion, in the column decoder DEC5, since the high positive voltage switch circuit HVSW2 is on and the negative voltage switch circuit NVSW3 is off, a voltage on the row line selection signal line C1 is a voltage on the VPP1, that is, 12 V, and voltages on the other row line selection signal lines are C2=V3=C4=0 V.

When a write data of "L", for example, is applied to the data input terminal DIN of FIG. 1B, the writing operation is performed, while the write data of "H" is applied, the writing operation is not performed and the erasing operation is performed at the erasing mode. When the signal of "L" is applied to the input terminal DIN in the case of PRG="H" and ER1=ER2="L", the output WRB of the NOR gate NR3 becomes "L" and the signal supplied to the data input terminal DIN is "L". Accordingly, in the data input buffer DIB, N7="H" and N8="L", so that the same voltage as that on VPP3, that is, 5 V is produced on the internal data line DIO. On the other hand, when DIN="H", the internal data line DIO is, for example, 0 V. In the multiplexer MPX, since only the transistor M1 is on, a signal of 5 V, for example, is applied to the row line BL0 when DIN="L" and a signal of 0 V, for example, is applied to the row line BL0 when DIN="H". Signals on the other row lines BL1, BL2 and BL3 are 0 V, for example.

In the writing mode, the high positive voltage switch circuit HVSW4 of the memory cell source line voltage control circuit ASCNT of FIG. 1B is on and the output N13 thereof is the same voltage as that of VPP2, that is, 5 V since the output PRGB of the inverter IV7 is "L" and the output ERSB2 is "H". Since the output N15 is "L" and both of the transistors M17 and M16 are off, the memory source line AS becomes an electrically open state.

In the bit line load circuit BLLD of FIG. 1B, since the gate voltages of the transistors M5, M6, M7 and M8 are "L", the transistors M5 to M8 are off.

Accordingly, in the writing mode, the control gate terminal, the drain terminal, the source terminal and the substrate terminal of the selected memory cell MC1 are, for example, −8 V, 5 V or 0 V, the open state, and 0 V, respectively. When 5 V is applied to the drain terminal, a high electric field is induced in the thin oxide layer between the floating gate and the drain region of the memory cell MC1 because of a voltage difference between the drain terminal and the control gate terminal and electrons are discharged from the floating gate to the drain region by the FN injection. Consequently, a threshold voltage of the memory cell MC1 is reduced (for example, from 7 V to 2 V), so that the memory cell MC1 becomes the written state. On the other hand, since a potential difference sufficient to start the FN injection does not occur in the non-selected memory cells MC2, ... MC16, the writing operation is not performed (the potential difference between the drain terminal and the control gate terminal exceeding 11 V, for example, is required in order to start the FN injection).

In the first erasing mode, that is, the block erasing mode, the voltage on the block erasing signal line of FIG. 1A is "H" (PRG=ER2="L"), so that the high positive charge pump circuit PCP and the negative voltage charge pump circuit NCP start operation to produce the output voltages 12 V and −8 V on the output lines POUT1 and POUT2, respectively. At this time, the high positive voltage control circuit HVCNT produces the output voltages of, for example, VPP1=WEL1=WEL2=10 V, VPP2=VPP3=ISO2=ISO3=5 V, and ISO1=WEL3=WEL4=WEL5=WEL6=0 V, and the negative voltage control circuit NVCNT produces the output voltages of, for example, VPN1=VPN2=VPN3=VSUM=−8 V.

When the address of A0=A1=A2=A3="L" is supplied in the same manner as in the writing mode, the high positive voltage switch circuit HVSW1 of the row decoder DEC1 is turned on and the negative voltage switch circuit NVSW1 is turned off, so that the same voltage as that of the VPP1, that is, 10 V is applied to the row line (word line) WL0. Voltages on the non-selected row lines WL1, WL2 and WL3 are 0 V, for example. Further, when the signal level on the block erasing signal line ER1 is changed to "H", the address buffers ADB3 and ADB4 produce the outputs of AY0=AY0B=AY1=AY1B="H" irrespective of an address value on the address terminals A2 and A3 to thereby turn off the high positive voltage switch circuits of the column decoders DEC5, DEC6, DEC7 and DEC8 and turn on the negative voltage switch circuits, so that the voltages on the column line selection signal lines C1, C2, C3 and C4 become the same voltage as that of VPN1, that is, −8 V.

In the first erasing mode, in the bit line voltage control circuit BLCNT of FIG. 1B, the high positive voltage switch circuit HVSW3 is off and the negative voltage switch circuit NVSW2 is on, so that the same voltage as that of VPN3, that is, −8 V is produced at the output line BDIS. Further, since the signal levels of the gates of the transistors M5, M6, M7 and M8 of the bit line load circuit BLLD are "L" and the voltage on the substrate thereof is −8 V (VSUB=−8 V), the transistors M5, M6, M7 and M8 are turned on so that the same voltage of −8 V as the substrate voltage VSUB are applied to the column lines (bit lines) BL0, BL1, BL2 and BL3. Since a negative voltage is applied to the drains of the transistors M1, M2, M3 and M4 of the multiplexer MPX and a negative voltage is also applied to the gates thereof, the transistors M1, M2, M3 and M4 are turned off. Further, the voltage on the internal data line DIO is, for example, 0 V or 5 V in accordance with the input data.

In the first erasing mode, the erasing can not be performed with a unit of one memory cell, but all of the memory cells MC1, MC2, MC3 and MC4 connected to the selected row line WL0 are erased. More particularly, since a voltage of, for example, of 10 V is applied to the control gate terminals of the memory cells MC1 to MC4 and a voltage of, for example, −8 V is applied to the drain terminals, the source terminals and the substrate terminals thereof, the FN injection occurs due to the potential difference between the substrate and the control gate, so that electrons are injected to the floating gate from the substrate in each memory cell. Consequently, the thresholds of the memory cells MC1, MC2, MC3 and MC4 are increased (for example, from 2 V to 7 V) so that the memory cells MC1, MC2, MC3 and MC4 become the erased state. The first mode erasing is also called "word line erasing", "block erasing" or "sector erasing".

In the second erasing mode, that is, the bit erasing mode, the voltage on the bit erasing signal line ER2 of FIG. 1A becomes "H" (PRG=ER1="L"), so that the high positive voltage charge pump circuit PCP starts its operation and the voltage on the output line POUT1 thereof becomes 12 V, for example. On the other hand, the negative voltage charge pump circuit NCP is not activated and the voltage on the output line POUT2 thereof is 0 V, for example. The high positive voltage control circuit HVCNT produces the output signals of, for example, VPP1=WEL1=WEL2=12 V, VPP2=VPP3=WEL3=WEL4=WEL5=WEL6=5 V and ISO1=ISO2=ISO3=0 V and the negative voltage control circuit NVCNT produces the output signals of, for example, VPN1=VPN2=VPN3=VSUB=0 V.

When the address of A0=A1=A2=A3="L" is supplied, the high positive voltage switch circuit HVSW1 of the row decoder DEC1 is turned on and the negative voltage switch circuit NVSW1 thereof is turned off, so that the same voltage as that of VPP1, that is, 12 V is applied to the row line WL0. At this time, the other row lines WL1, WL2 and WL3 are not selected and the voltages on the other row lines are 0 V, for example. Further, the high positive voltage switch circuit HVSW2 of the column decoder DEC5 is turned on and the negative voltage switch circuit NVSW3 is turned off, so that the same voltage of 12 V as that of VPP1 is applied to the column line selection signal line C1. At this time, the voltages on the non-selected column lines C2, C3 and C4 are 0 V, for example.

In the second erasing mode, since the input signals PRGB and ERSB2 of the memory source line voltage control circuit ASCNT of FIG. 1B are "H" and "L", respectively, that is, PRGB="H" and ERSB2="L", the high positive voltage switch circuit HVSW4 is turned off and the node N13 becomes "L", so that the output N15 of the inverter IV5 becomes "L". Accordingly, the transistor M17 is turned off and the transistor M16 is turned on, so that the voltage on the memory source line AS becomes the same voltage as that of VPP2, for example 5 V. Thus, when the signal of the "H" level is applied to the data input terminal DIN, the voltage on the internal data line DIO becomes 0 V and when the signal of the "L" level is applied to the data input terminal DIN, the voltage of the internal data line DIO becomes the same voltage as that of VPP3, for example 5 V. When the signal of "H" level is applied to the data input terminal DIN, the high positive voltage switch circuit HVSW3 of the bit line voltage control circuit BLCNT is turned on and the negative voltage switch circuit NVSW2 is turned off, so that the same voltage as that of VPP3, for example 5 V appears on the output BDIS. Further, since the gate input signals of the transistors M5, M6, M7 and M8 of the bit line load circuit BLLD are "H", the transistors are turned on. In addition, since the transistor M1 of the multiplexer MPX is on, a current flows from the VPP3 through BDIS, BL0 and DIO to the ground terminal. At this time, by setting a resistance value of the transistor M5 to be sufficiently larger than that of the transistor M1, the voltage on the column line BL0 can be set to approximately 0 V. Further, since the column lines BL1, BL2 and BL3 have no path through which any current flows, the voltages on the column lines BL1, BL2 and BL3 are set to substantially the same voltage as that of BDIS, for example 5 V.

In this manner, the bit line voltage control circuit BLCNT sets the voltage on the column line connected to the selected memory cell and the voltage on the column lines connected to the non-selected memory cells to the respective selected values suitable for the bit erasing in cooperation with the bit line load circuit BLLD in the bit erasing mode.

Accordingly, the voltages of 12 V, 5 V, 0 V and 0 V are applied to the control gate terminal, the source electrode, the drain electrode and the substrate electrode of the memory cell MC1 selected at this time, respectively, so that electrons are injected from the channel to the floating gate of the memory cell MC1 by the HE injection. Consequently, the threshold of the memory cell MC1 is raised (for example, from 2 V to 7 V). At this time, the voltage of 12 V is also applied to the control gate terminals of the non-selected memory cells MC2, MC3 and MC4, while since the voltages at the drain electrode and the source electrode are as high as 5 V and there is no potential difference between the drain electrode and the source electrode, neither the FN injection nor the HE injection occurs in the memory cells MC2 to MC4. Further, since the other non-selected memory cells MC5, MC9 and MC13 have the control gate voltage of 0 V, the source electrode of 5 V and the drain electrode of 0 V, the memory cells MC5, MC9 and MC13 are off and the potential difference thereof is small, so that neither the FN injection nor the HE injection occurs. On the other hand, when the signal of "L" is applied to the data input terminal DIN, no current flows in the selected bit line, too, so that the erasing is not performed. Accordingly, in the second erasing mode, only the selected memory cell MC1 can be erased and whether the erasing operation is performed or not can be controlled in accordance with the input data.

In the reading mode, since the voltages on the lines PRG, ER1 and ER2 of FIG. 1A are "L", that is, PRG=ER1=ER2= "L" and the high positive voltage charge pump circuit PCP and the negative voltage charge pump circuit NCP are not activated, the voltages on the output lines POUT1 and POUT2 thereof are, for example, 0 V, that is, POUT1= POUT2=0 V. At this time, the high positive voltage control circuit HVCNT produces the outputs of, for example, VPP1=VPP2=VPP3=5 V and WEL1=WEL2=WEL3= WEL4=WEL5=WEL6=5 V and ISO1=ISO2=ISO3=0 V. Further, the negative voltage control circuit NVCNT produces the outputs of, for example, VPN1=VPN2=VSUB=0 V. At this time, the output WRB of the three-input NOR gate NR3 of FIG. 1B is "H", so that the data input buffer DIB becomes the inactive state and the sense amplifier circuit SAMP and the output buffer DBF are activated. Thus, when the address of, for example, A0=A1=A2=A3="L" is supplied, the voltage on the row line WL0 is, for example, 5 V and if the memory cell MC1 is in the written state (for example, threshold voltage is 2 V), the memory cell MC1 is in the on state and a current flows, for example, from the sense amplifier SAMP through the internal data line DIO and the bit line BL0 (at this time, the voltage on the bit line BL0 is supplied from the sense amplifier SAMP). Further, if the memory cell MC1 is in the erased state (for example, the threshold voltage is 7 V), the memory cell MC1 is in the off state and the above-mentioned current does not flow. The current is detected and amplified by the sense amplifier SAMP and the output thereof is produced through the output buffer DBF to the output terminal DO.

Figure 2:
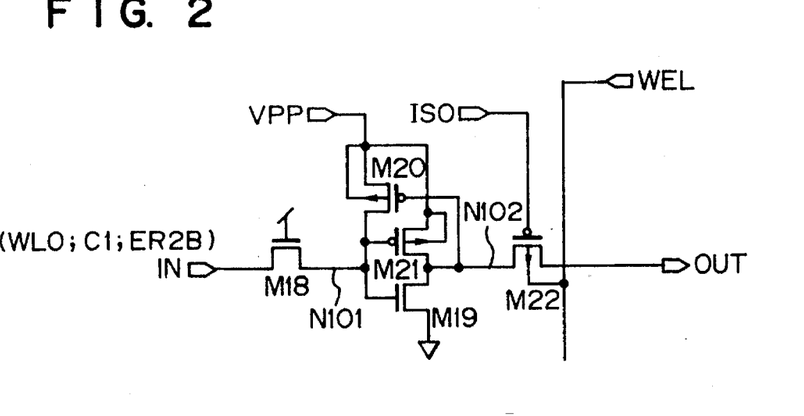
FIG. 2 is a circuit diagram schematically illustrating a high positive voltage switch circuit HVSW 1 - 3.

FIG. 2 is a schematic diagram illustrating an example of the high positive voltage switch circuits HVSW1 to HVSW3 shown in FIGS. 1A and 1B.

The high positive voltage switch circuit includes, for example, N-channel enhancement type MOS transistors M18 and M19, P-channel enhancement type MOS transistors M10 and M21, a P-channel depletion type MOS transistor M22, a switch input terminal IN, a high positive voltage input terminal VPP, a negative voltage blocking signal input terminal ISO, a substrate input terminal WEL, an output terminal OUT, a power supply terminal, and a ground terminal. The thresholds of the N-channel enhancement type MOS transistors M18, M19, the P-channel enhancement type MOS transistors M20, M21, and P-channel depletion type MOS transistor M22 are, for example, 0.8 V, −0.8 V, and 2 V, respectively.

As shown in FIG. 2, the drain terminal of the transistor M18 is connected to the switch input terminal IN and the gate terminal thereof is connected to the power supply voltage, the source terminal thereof being connected to a node N101. The switch input terminal IN is connected to WL0 for HVSW1, C1 for HVSW2, and ER2B for HVSW3. Further, the transistor M19 includes the gate terminal connected to the node N101, the drain terminal connected to a node N102, the source terminal connected to the ground terminal, and the transistor M20 includes the gate terminal connected to the node N102, the drain terminal connected to the node N101, and the source terminal connected to the high positive voltage input terminal VPP. The transistor M21 includes the gate terminal connected to the node N101, the drain terminal connected to the high positive voltage input terminal VPP, and the source terminal connected to the node N102, and the transistor M22 includes the source terminal connected to the node N102, the gate terminal connected to the negative voltage blocking signal input terminal ISO, and the drain terminal connected to the output terminal OUT. Further, the substrate terminals of the transistors M18 and M19 are connected to the ground terminal and the substrate terminals of the transistors M20 and M21 are connected to the high positive voltage input terminal VPP, the substrate terminals of the transistor M22 being connected to the substrate input terminal WEL.

The high positive voltage switch circuit operates with any of the switch operation with the normal power supply voltage, the switch operation with the high positive voltage, and the switch operation for blocking a negative voltage.

In the switch operation with the normal power supply voltage, when the power supply voltage is, for example, 5 V, a voltage at the high positive voltage input terminal VPP is also 5 V and a voltage at the negative voltage blocking signal input terminal ISO is 0 V, a voltage at the substrate input terminal WEL being 5 V. At this time, when a voltage at the switch input terminal IN is 5 V, N1=5 V, N2=0 V, and the output terminal OUT=0 V. On the other hand, when the switch input terminal IN=0 V, the output terminal OUT=5 V.

In the switch operation with the high positive voltage, when the power supply voltage is, for example, 5 V and a voltage at the high positive voltage input terminal VPP is, for example, 12 V, voltages at ISO and WEL are 0 V and 12 V, respectively. At this time, when a voltage at the switch input terminal IN is 5 V, N1=12 V, N2=0 V and OUT=0 V. Further, when a voltage at the switch input terminal IN is 0 V, OUT=12 V.

The switch operation for blocking the negative voltage is the operation for electrically insulating the output terminal OUT and the node N2 when a negative voltage is applied to the output terminal OUT from the outside. That is, when the power supply voltage and voltages at VPP, IN, ISO and WEL are, for example, 5 V, 5 to 12 V, 5 V, 5 V, and 0 V, respectively, voltages at the nodes N1 and N2 are 5 to 12 V and 0 V, respectively, and the transistor M22 is off even when a negative voltage is applied to the output terminal OUT.

Figure 3:
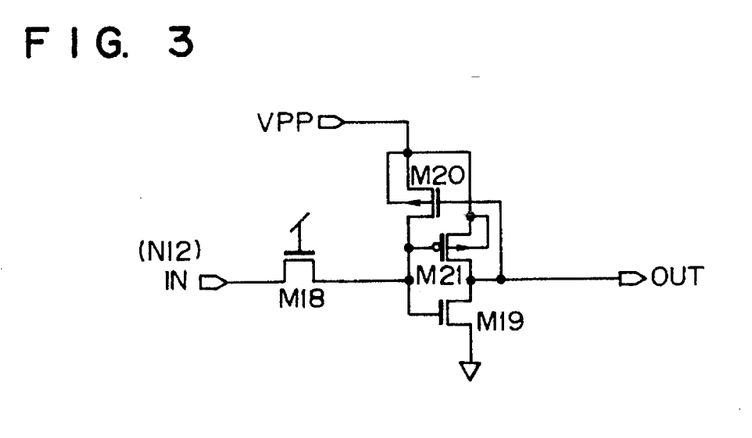
FIG. 3 is a circuit diagram schematically illustrating a high positive voltage switch circuit HVSW 4.

FIG. 3 is a schematic diagram illustrating an example of the high positive voltage switch circuit HVSW4 shown in FIG. 1B. The high positive voltage switch circuit has the same circuit configuration and operation as those of the high positive voltage switch circuit shown in FIG. 2 except that the transistor, the input terminals and the wiring required for the switch operation for blocking of the negative voltage are omitted.

Figure 4:
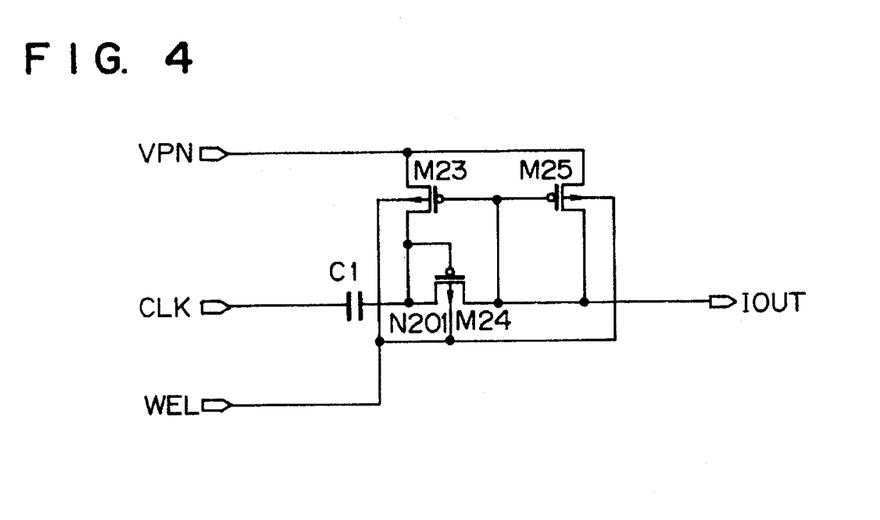
FIG. 4 is a circuit diagram schematically illustrating a negative voltage switch circuit of FIGS. 1A and 1B.

FIG. 4 is a schematic diagram illustrating an example of the negative voltage switch circuits NVSW1 to NVSW3 shown in FIGS. 1A and 1B.

The negative voltage switch circuit includes, for example, P-channel enhancement type MOS transistors M23, M24 and M25, a capacitor C1, a clock input terminal CLK, a negative voltage input terminal VPN, a substrate voltage terminal WEL, and an input/output terminal IOUT. A threshold of the P-channel enhancement type MOS transistors M23 to M25 is, for example, 0.8 V.

As shown in FIG. 4, the clock input terminal CLK is connected to one terminal of the capacitor C1 and a node N201 is connected to the other terminal of the capacitor C1. The gate and the drain terminals of the transistor M24 are connected to the node N201 and the source terminal thereof is connected to the input/output terminal OUT. The transistor M23 includes the source terminal connected to the negative voltage input terminal VPN, the gate terminal connected to the input/output terminal OUT, and the drain terminal connected to the node N201. The source terminal of the transistor M25 is connected to the negative voltage input terminal VPN and the gate and drain terminals thereof are connected to the input/output terminal IOUT. The substrate terminals of the transistors M23 to M25 are connected to the substrate voltage terminal WEL.

The negative voltage switch circuit operates under the switch-off state where a positive voltage is applied to the input/output terminal IOUT or the switch-on state where a negative voltage is produced to the input/output terminal IOUT.

In the switch-off state, a voltage at the clock input terminal CLK is fixed to "L" or "H" level, and voltages at the negative voltage input terminal VPN and the substrate voltage terminal WEL are 0 V and 5 to 12 V, for example, respectively. At this time, even when a voltage of 5 to 12 V is applied to the input/output terminal IOUT, the transistors M23 to M25 are off and the negative voltage input terminal VPN is electrically insulated from the input/output terminal IOUT.

In the switch-on state, an input signal to the clock input terminal CLK is oscillated (for example, with an amplitude of 5 V in a period of 30 MHz), a negative voltage, for example −8 V, is applied to the negative voltage input terminal VPN, and a voltage on the substrate voltage terminal WEL is, for example, 0 V. At this time, since the node N201 is capacitively coupled with the clock input terminal CLK through the capacitor C1, electric charges are induced at the node N201 in accordance with a capacitance value of the capacitor C1 and an amplitude of the input signal to the clock input terminal and a voltage at the node N201 is swung largely in the negative direction (the voltage is not almost swung since a forward diode from the drains of the transistors M23 and M24 is formed because of a voltage of 0 V at the substrate voltage terminal WEL). The input/output terminal IOUT is in the open state near to 0 V upon starting of the switch operation, while the transistor M24 is turned on by changing a voltage at the node N201 to a negative voltage, and a voltage at the input/output terminal IOUT also becomes negative. Accordingly, the transistor M23 is also turned on and positive electric charges at the node N201 flow into the negative voltage input terminal VPN in accordance with the period of the input signal to the clock input terminal CLK, so that the voltage at the node N201 is reduced increasingly. When the voltage at the input/output terminal IOUT is equal to the voltage at the negative voltage input terminal VPN, the transistor M23 is off and the voltage at the input/output terminal IOUT becomes, for example, −8 V.

The embodiment of the present invention has been described, while the present invention is not limited to the embodiment. For example, the arrangement and configuration of the memory cells are not limited to the embodiment, while a plurality of memory source lines may be provided so that the memory source lines may be decoded by an output signal of the column decoder. The number of data bits is one in the embodiment, while a plurality of bits may be read or written simultaneously. Further, in the embodiment, the selection signals for the writing mode and the first and second erasing modes are inputted from the outside, while it is not required and other input signals may be used therefor. In addition, the first erasing mode is performed with a unit of one row line in the embodiment, while it is a matter of course that the first erasing mode may be performed with a unit of a plurality of row lines or a unit of all row lines. Further, a configuration of the memory cells is not specified particularly. The voltage values used in the embodiment may be modified properly within the technical concept of the present invention (for example, the substrate voltage of the memory cell in the first erasing mode is not limited to a negative voltage and may be about the ground potential).

According to the present invention, the electrically alterable non-volatile semiconductor memory device can perform writing and erasing with a unit of one bit in the operation for altering in spite of the memory cell constituted by a signal transistor and can perform the operation for altering at high speed as compared with the prior art (in the prior art, since only the FN injection is used for the erasing, the erasing with a unit of one bit can not be attained and the erasing time requires, for example, 10 ms, whereas in the present invention the erasing time is, for example, 10 μs). Further, in the prior art, when one bit is to be altered, addresses and bits which are not required to be altered are altered and accordingly the time and the number of steps in alteration are increased unnecessarily, whereas in the present invention such disadvantages are eliminated.

Furthermore, when a plurality of addresses are all altered, particularly, in the erasing operation, the consumption current and the altering time can be reduced by using the circuit means for the row line erasing or the block erasing (for example, in a semiconductor memory device having a memory capacity of 4096 rows×512 columns×8 bits, time required to erase the whole memory is about 2 seconds in the bit erasing method, while it is 10 ms in minimum in the block erasing).

According to the present invention, it is possible to alter the memory with either a unit of bit or a unit of row line (i.e.

a unit of block). Thus, the use can select the mode of alteration depending on the number of addresses and bits to be altered.

I claim:

1. An electrically alterable non-volatile semiconductor memory device comprising:

a plurality of memory cells formed on a semiconductor substrate and arranged in a matrix of columns and rows, each memory cell having a control gate, a floating gate, a drain and a source;

a plurality of row lines each connected to the control gates of said memory cells arranged in one row;

a plurality of column lines each connected to the drains of said memory cells arranged in one column;

one source line connected to the sources of said plurality of memory cells;

a row decoder for selecting one of said plurality of row lines;

a column decoder for selecting one of said plurality of column lines;

an input terminal for receiving data which is to be written in a selected memory cell;

mode selection means for selecting one of four modes, including a writing mode for setting a selected one of said plurality of memory cells in a written state in accordance with said received data, a first erasing mode for setting a memory cell group arranged in one row including said selected memory cell in an unwritten state, a second erasing mode for setting only the selected memory cell in the unwritten state, and a reading mode for detecting whether said selected memory cell is in said written state or said unwritten state; and voltage applying means for applying one set of voltages, selected from first, second, third and fourth predetermined sets of voltages, in accordance with the mode selected by said mode selection means to a row line selected by said row decoder, non-selected row lines, a column line selected by said column decoder, non-selected column lines, said source line and said substrate, respectively;

said voltage applying means including voltage selection means for applying a voltage having the same level to said selected column line and said non-selected column lines when said first erasing mode is selected and for applying a first voltage to said selected column line and applying a second voltage higher than said first voltage to said a source line when said second erasing mode is selected.

2. A non-volatile semiconductor memory device according to claim 1, wherein said first voltage is at a ground potential and said second voltage is at a potential higher than the ground potential.

3. A non-volatile semiconductor memory device according to claim 1, wherein said voltage selection means includes means for causing said column decoder not to select less than all of said plurality of column lines in said first erasing mode and to select only a column line connected to said selected memory cell in said second erasing mode.

4. A non-volatile semiconductor memory device according to claim 3, wherein said voltage selection means further includes means for applying to said plurality of column lines a voltage having the same level as that of the voltage applied to said substrate in said first erasing mode.

5. A method of using an electrically alterable non-volatile semiconductor memory device including a plurality of memory cells formed on a semiconductor substrate and arranged in a matrix of columns and rows and each having a control gate, a floating gate, a drain and a source, a plurality of row lines each connected to the control gates of said memory cells arranged in one row, a plurality of column lines each connected to the drain of said memory cells arranged in one column, one source line connected to the sources of said plurality of memory cells, a row decoder for selecting one of said plurality of row lines, a column decoder for selecting one of said plurality of column lines, an input terminal for receiving data which is to be written in a selected memory cell, and mode selection means for selecting one of four modes, including a writing mode for setting a selected one of said plurality of memory cells in a written state in accordance with said received data, a first erasing mode for setting a memory cell group arranged in one row including said selected memory cell in an unwritten state, a second erasing mode for setting only said selected memory cell in the unwritten state, and a reading mode for detecting whether said selected memory cell is in said written state or said unwritten state, said method comprising the steps of:

applying a voltage having substantially the same level as a voltage applied to said substrate to all of said plurality of column lines and injecting electrons by FN injection from said substrate to said floating gate of each of the memory cells connected to one row line selected by said row decoder thereby setting said memory cells in said unwritten state when said first erasing mode is selected;

setting one column line selected by said column decoder in a ground potential and applying a voltage higher than the ground voltage to said source line to inject hot electrons in said floating gate of said selected memory cell thereby setting said selected memory cell in said unwritten state when said second erasing mode is selected; and applying a voltage having substantially the same level as the voltage applied to said source line to the column lines other than one column line selected by said column decoder to prevent hot electrons from being injected in the floating gates of those memory cells connected to said selected row line other than said selected one.

6. A method according to claim 5, further comprising:

a step of applying a voltage having substantially the same level as a voltage applied to said substrate to said source line when said first erasing mode is selected; and a step of setting said substrate to the ground potential when said second erasing mode is selected.

7. A method according to claim 5, further comprising a step of setting one column line selected by said column decoder to the grounds potential or a voltage higher than the ground potential in accordance with a level of a signal applied to said input terminal when said second erasing mode is selected and preventing hot electrons from being injected in the floating gate of said selected memory cell when the voltage higher than the ground potential is applied.

* * * * *